United States Patent
Tu et al.

(10) Patent No.: US 10,170,508 B2
(45) Date of Patent: Jan. 1, 2019

(54) OPTICAL PACKAGE STRUCTURE

(71) Applicant: Kingpak Technology Inc., Hsin-Chu County (TW)

(72) Inventors: Hsiu Wen Tu, Hsin-Chu County (TW); Chung-Hsien Hsin, Hsin-Chu County (TW); Jina-Ru Chen, Hsin-Chu County (TW)

(73) Assignee: KINGPAK TECHNOLOGY INC., Hsin-Chu County (TW)

( * ) Notice: Subject to any disclaimer, the term of this patent is extended or adjusted under 35 U.S.C. 154(b) by 0 days.

(21) Appl. No.: 15/623,596

(22) Filed: Jun. 15, 2017

(65) Prior Publication Data

US 2017/0365632 A1 Dec. 21, 2017

Related U.S. Application Data

(60) Provisional application No. 62/353,154, filed on Jun. 22, 2016, provisional application No. 62/352,608, filed on Jun. 21, 2016.

(30) Foreign Application Priority Data

Feb. 7, 2017 (CN) .......................... 2017 1 0067651

(51) Int. Cl.
| | |
|---|---|
| *H01L 27/146* | (2006.01) |
| *H01L 31/0203* | (2014.01) |
| *H01L 23/31* | (2006.01) |
| *H01L 23/00* | (2006.01) |

(52) U.S. Cl.
CPC .... *H01L 27/14618* (2013.01); *H01L 23/3128* (2013.01); *H01L 24/73* (2013.01); *H01L 27/14636* (2013.01); *H01L 31/0203* (2013.01); *H01L 2224/73265* (2013.01)

(58) Field of Classification Search
CPC ....... H01L 23/02; H01L 23/053; H01L 23/12; H01L 23/13; H01L 23/28; H01L 23/3107; H01L 23/3121; H01L 23/315
See application file for complete search history.

(56) References Cited

U.S. PATENT DOCUMENTS

| | | | |
|---|---|---|---|
| 6,384,473 B1* | 5/2002 | Peterson | B81B 7/0067 257/680 |
| 2003/0201507 A1* | 10/2003 | Chen | H01L 27/14618 257/433 |
| 2005/0073036 A1* | 4/2005 | Appelt | H01L 23/4334 257/678 |

(Continued)

*Primary Examiner* — Eduardo A Rodela
*Assistant Examiner* — Nilufa Rahim
(74) *Attorney, Agent, or Firm* — WPAT, PC (57) ABSTRACT

An optical package structure is provided. The optical package structure includes a substrate, a frame layer, an optical unit, a bonding layer, a transparent plate and an encapsulation layer. The frame layer formed on the substrate surrounds a cavity where the optical unit is located. The bonding layer covers a portion of an upper edge of the frame layer and exposes the other portion of the upper edge of the frame layer. The transparent plate mounted on the bonding layer extends across the optical unit and extends beyond an outer edge of the bonding layer. The encapsulation layer covers a lateral edge of the transparent plate and the outer edge of the bonding layer.

11 Claims, 8 Drawing Sheets

(56) References Cited

U.S. PATENT DOCUMENTS

2005/0161805 A1* 7/2005 Ono .................. H01L 27/14618
                                                    257/704
2006/0087017 A1* 4/2006 Chao ................. H01L 27/14618
                                                    257/680
2017/0345862 A1* 11/2017 Kinsman ........... H01L 27/14634

* cited by examiner

OPTICAL PACKAGE STRUCTURE

CROSS-REFERENCE TO RELATED APPLICATIONS

The present application is a nonprovisional application claiming benefit from a prior-filed provisional application bearing a Ser. No. 62/352,608 and filed Jun. 21, 2016 and a prior-filed provisional application bearing a Ser. No. 62/353,154 and filed Jun. 22, 2016, the entity of which is incorporated herein for reference.

FIELD OF THE INVENTION

The present disclosure relates to an optical package structure, and particularly to an optical package structure with higher reliability and smaller dimension.

BACKGROUND OF THE INVENTION

Figure 1:
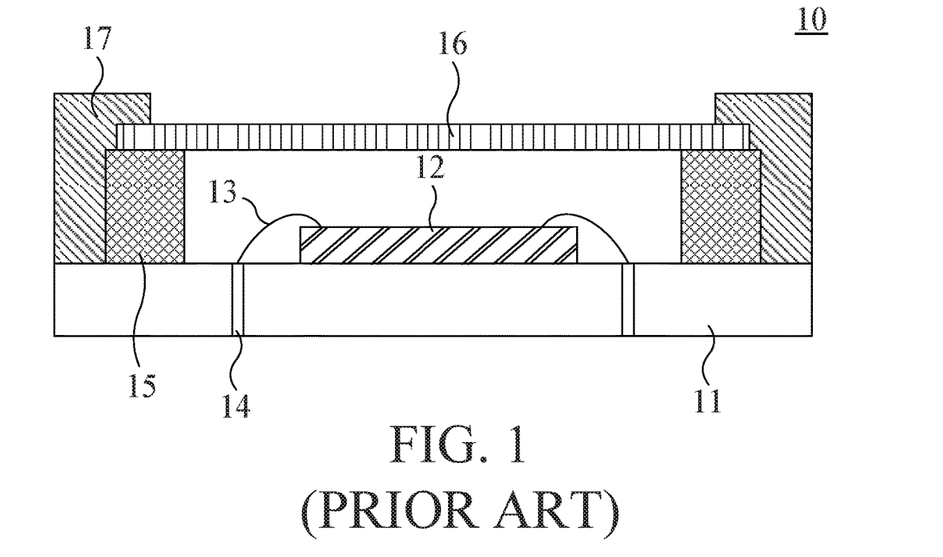
FIG. 1 is a side cross-sectional view illustrating the conventional image sensor package structure.

Please refer to FIG. 1, a side cross-sectional view illustrating the conventional image sensor package structure. In the image sensor package structure 10, an image sensor chip 12 is mounted on a substrate 11 and electrically connected to external circuits (not shown) via wires 13 and through holes 14 in the substrate 11. A frame layer 15 is disposed on the substrate 11 and surrounds the image sensor chip 12. A transparent plate 16 is mounted on the frame layer 15 so that the image sensor chip 12 is disposed in a cavity defined by the substrate 11, the frame layer 15 and the transparent plate 16. An encapsulation layer 17 covers the substrate 11, the frame layer 15 and edges of the transparent plate 16.

When the image sensor package structure 10 is put in a strict environment (high temperature and high humidity) for use or test, vapor or moisture easily enters in the cavity through the through holes 14 and small water drops are formed on a sensing surface of the image sensor chip 12 or a lower surface of the transparent plate 16. Under this condition, sensed image quality of the image sensor chip 12 is seriously affected due to the small water drops. Furthermore, the vapor or moisture floating in the cavity affects electrical performance of electrical elements in the package structure. Therefore, such influence seriously degrades the quality and reliability of the optical unit so that the image sensor package structure 10 can not meet product specification and long term use requirement.

Furthermore, the large package size of the conventional image sensor package structure 10 has been a major issue for years. Thus, the production cost cannot be reduced due to the required material consumption, abrasion of production tools and corresponding maintenance cost.

Moreover, since the encapsulation layer 17 of the image sensor package structure 10 covers a portion of an upper surface of the transparent plate 16, encapsulation material is likely to contaminate or dirty the upper surface of the transparent plate 16 during the encapsulation process. Thus, abnormal operation of the image sensor package structure 10 may occur.

Therefore, an optical package structure with higher reliability and smaller dimension without degrading the performance thereof is desired to solve the above-mentioned problem.

SUMMARY OF THE INVENTION

An aspect of the present disclosure provides an optical package structure. The optical package structure includes: a substrate having a first surface and a second surface opposite to the first surface; a frame layer formed on the first surface of the substrate and surrounding a cavity on the substrate; an optical unit disposed on the first surface of the substrate and located inside the cavity; a bonding layer formed on a portion of an upper edge of the frame layer and exposing the other portion of the upper edge of the frame layer; a transparent plate mounted on the bonding layer and extending across the optical unit, wherein the transparent plate extends beyond an outer edge of the bonding layer; and an encapsulation layer covering a lateral edge of the transparent plate and the outer edge of the bonding layer, and partially covering the second surface of the transparent plate and the upper edge of the frame layer.

Another aspect of the present disclosure provides an optical package structure. The optical package structure includes: a substrate having a first surface and a second surface opposite to the first surface; a frame layer formed on the first surface of the substrate and surrounding a cavity on the substrate; an optical unit disposed on the first surface of the substrate and located inside the cavity; at least one wire electrically connected to the optical unit; a transparent plate mounted on the frame layer and covering the cavity; and an encapsulation layer covering a lateral edge of the transparent plate and the outer edge of the frame layer. A plurality of through holes are provided in the substrate and connecting the first surface and the second surface of the substrate. Openings of the through holes on the first surface of the substrate are located under the optical unit, the frame layer or the encapsulation layer. A protection film is formed between the openings of the through holes and the optical unit, the frame layer or the encapsulation layer. The wire is electrically connected to the through holes.

BRIEF DESCRIPTION OF THE DRAWINGS

The advantages of the present disclosure will become more readily apparent to those ordinarily skilled in the art after reviewing the following detailed description and accompanying drawings, in which.

DETAILED DESCRIPTION OF PREFERRED EMBODIMENTS

The present disclosure will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2:
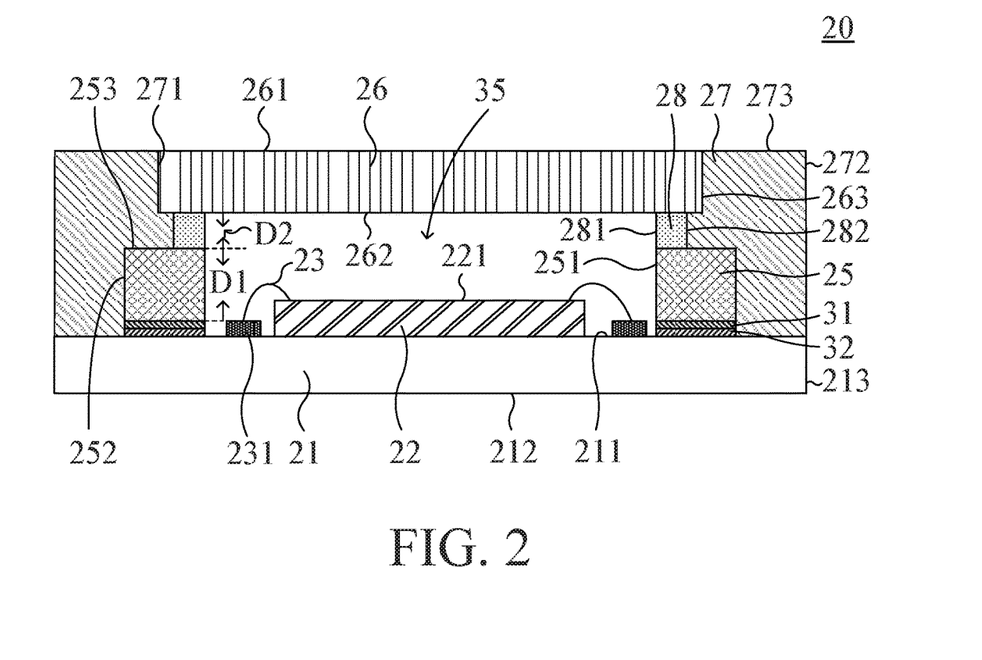
FIG. 2 is a side cross-sectional view illustrating an optical package structure according to an embodiment of the present disclosure.

Please refer to FIG. 2, a side cross-sectional view illustrating an optical package structure according to an embodiment of the present disclosure. The optical package structure 20 includes a substrate 21, an optical unit 22, a frame layer 25, a bonding layer 28, a transparent plate 26 and an encapsulation layer 27. The substrate 21 (e.g. plastic substrate) has a first surface 211 and a second surface 212, both of which are opposite to each other. The optical unit 22 is mounted on the first surface 211 of the substrate 21 by an adhesive layer, glue, die bond epoxy or other bonding method. The working surface (sensing surface) 221 of the optical unit 22 faces away from the substrate 21, i.e. toward the transparent plate 26. Several pads 231 are disposed on the first surface 211 of the substrate 21 and electrically connected to solder balls, pins, leads, pads, traces or electrodes (not shown) on the second surface 212 of the substrate 21. The optical unit 22 is electrically connected to the pads 231 via wires 23. The quantity of the pads 231 and the wires 23 are determined according to requirement of the practical application to allow transmission of sensing signals from the optical unit 22 to an external circuit (not shown) or transmission of driving signals from the external circuit to the optical unit 22. In an embodiment, the optical unit 22 is an image sensor chip, but is not limited to this. The package structure disclosed herein is applicable to any moisture sensitive optical unit to increase its reliability and weatherability.

The frame layer 25 is disposed on the substrate 21 and surrounds the optical unit 22 to protect the optical unit 22 from surrounding impact. The frame layer 25 and the substrate 21 may use the same material, e.g. plastic. Alternatively, elastomer or silicone may be used to form the frame layer 25. The frame layer 25 may be fixed to the first surface 211 of the substrate 21 by any known bonding method. In an embodiment, the frame layer 25 is adhered to the first surface 211 of the substrate 21 by a lamination film 31.

The transparent plate 26 has a first surface 261 and a second surface 262, both of which are opposite to each other. The second surface 262 faces toward the optical unit 22. The transparent plate 26 is mounted on the frame layer 25 and extends across the optical unit 22. In other words, a gap is formed between the transparent plate 26 and the optical unit 22. The transparent plate 26 may be glass, lens or a plate penetrable to light. The transparent plate 26 may be further coated at one or two of the surfaces 261 and 262. The layer coated on the transparent plate 26 may select at least one optical layer including an anti-reflection (AR) layer, an infrared (IR) pass layer, an infrared cut layer and an ultraviolet (UV) cut layer.

The bonding layer 28 is disposed between the frame layer 25 and the transparent plate 26 via, for example, coating. The material of the bonding layer 28 may be glass mount epoxy (GME) which has better bonding effect on glass. Thus, a closed cavity 35 is defined by the surfaces of the substrate 21, the frame layer 25, the bonding layer 28 and the transparent plate 26, and the optical unit 22 is disposed in the cavity 35. Roughly speaking, the bonding layer 28 does not extend beyond an inner edge 251 of the frame layer 25. For example, the inner edge 281 of the bonding layer 28 is aligned with the inner edge 251 of the frame layer 25, or the inner edge 281 of the bonding layer 28 is located between the inner edge 251 and an outer edge 252 of the frame layer 25. Such design prevents the material of the boding layer 28 from flowing into the cavity 35 to touch inner wires and elements. The transparent plate 26 extends beyond the outer edge 282 of the bonding layer 28. In other words, an upper edge of the bonding layer 28 is completely covered by the transparent plate 26. Because the sum of the height D2 of the bonding layer 28 and the height D1 of the frame layer 25 is equal to the height of the cavity 35, the working distance of the optical unit 22, i.e. the distance between the first surface 261 of the transparent plate 26 and the optical unit 22, can be well set by properly determining the height D1 of the frame layer 25 and/or the height D2 of the bonding layer 28. The manufacturer may adjust one or both heights D1 and D2 according to the process complexity and aspect ratio of the frame layer 25 and the bonding layer 28. Longer working distance will decrease the influence of particles or contaminants on the first surface 261 or the second surface 262 of the transparent plate 26, but increasing the overall height of the optical package structure 20 or the height of the cavity 35 is likely to affect the reliability of the optical package structure 20.

The encapsulation layer 27 is formed on a portion of the first surface 211 of the substrate 21 to retard entry of vapor or moisture into the cavity 35. The material of the encapsulation layer 27 is a molding compound. An outer edge 272 of the encapsulation layer 27 is aligned with an lateral edge 213 of the substrate 21, while an inner edge 271 of the encapsulation layer 27 completely or nearly completely covers a lateral edge 263 of the transparent plate 26, and completely covers the outer edge 282 of the bonding layer 28 and the outer edge 252 of the frame layer 25. An upper edge 273 of the encapsulation layer 27 is approximately level with the first surface 261 of the transparent plate 26. The outer edge 282 of the bonding layer 28 is set back from the lateral edge 263 of the transparent plate 26 and the outer edge 252 of the frame layer 25. In other words, a distance between the inner edge 281 and the outer edge 282 of the bonding layer 28 is shorter than a distance between the inner edge 281 of the bonding layer 28 and the lateral edge 263 of the transparent plate 26, and also shorter than a distance between the inner edge 281 of the bonding layer 28 and the outer edge 252 of the frame layer 25. Therefore, the inner edge 271 of the encapsulation layer 27 is in contact with and adhered to the lateral edge 263 of the transparent plate 26, a portion of the second surface 262 of the transparent plate 26 (i.e. the portion between the outer edge 282 of the bonding layer 28 and the lateral edge 263 of the transparent plate 26), the outer edge 282 of the bonding layer 28, a portion of an upper edge 253 of the frame layer 25 (i.e. the portion between the outer edge 282 of the bonding layer 28 and the outer edge 252 of the frame layer 25), and the outer edge 252 of the frame layer 25. The encapsulation layer 27 is further in contact with and adhered to a portion of the first surface 211 of the substrate 21 (i.e. the portion between the outer edge 252 of the frame layer 25 and the lateral edge 213 of the substrate 21). Therefore, the overall area of the contact surfaces with different directions between the encapsulation layer 27 and other layers is increased. The mechanical stress applied on the contact surfaces between the encapsulation layer 27 and the transparent plate 26, the bonding layer 28 and the frame layer 25 is dispersed so as to provide better clamping and locking effects. According to another aspect of the present disclosure, the upper edge 273 of the encapsulation layer 27 is not higher than the first surface 261 of the transparent plate 26. Therefore, it is effectively prevents from the material of the encapsulation layer 27 flowing on the transparent plate 26 during the encapsulation process and contaminating the transparent plate 26. Such design ensures normal operation of the optical package structure 20 and reducing difficulty of the cleaning step after the encapsulation process. Moreover, amount of the material used for forming the encapsulation layer 27 is reduced by eliminating the protruding portion above the first surface 261 of the transparent plate 26 so as to decrease the product cost of the optical package structure 20.

After the packaging process, the optical package structure 20 should be subjected to a temperature cycle test, e.g. AEC-Q100 test for qualifying integrated circuits (ICs) for automotive applications. During the reliability tests about mechanical stress, the optical package structure 20 undergoes at least of 1000 cycles of thermal cycling from −65° C. to +150° C. to check whether the optical package structure 20 can endure thermal cycling without peeling at the contact surfaces between layers. The above-mentioned lamination film 31 between the frame layer 25 and the substrate 21 can absorb stresses to prevent delamination between the frame layer 25 and the substrate 21. Thus, the weatherability and reliability of the optical package structure 20 are effectively enhanced.

To electrically connecting the pads 231, traces or circuits (not shown) on the first surface 211 of the substrate 21 to the solder balls, pins, leads, pads, wires or electrodes on the second surface 212 of the substrate 21, several conductive structures are provided in the substrate 21 between the first surface 211 and the second surface 212. For example, through holes/vias are usually disposed near the pads 231. The present disclosure further improves the optical package structure 20. Please refer to FIG. 3, a side cross-sectional view illustrating an optical package structure according to another embodiment of the present disclosure. Openings of the through holes 24 on the first surface 211 of the substrate 21 are arranged to be under the optical unit 22, the frame layer 25, the encapsulation layer 27 or other circuit chips (not shown). If the lamination film 31 is provided, the openings may be arranged under the lamination film 31.

Figure 3:
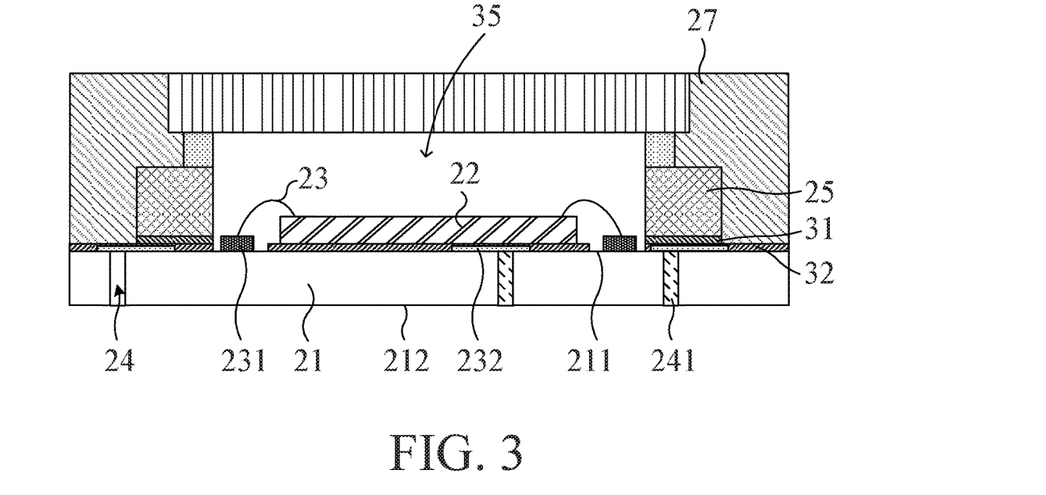
FIG. 3 is a side cross-sectional view illustrating an optical package structure according to another embodiment of the present disclosure.

Traces 232 routed over the first surface 211 of the substrate 21 and in contact with the through holes 24 can perform signal transmission between the external circuits and the components inside the optical package structure. A protection film 32, e.g. solder mask or solder resist, is applied to the traces 232 for protecting the traces 232 against oxidation, corrosion or scratch and preventing short circuit resulting from solder bridges between closely spaced solder pads. It is to be noted that the quantity and the positions of the through holes are not limited to this embodiment. Furthermore, the optical unit 22, the frame layer 25, the encapsulation layer 27 and the protection film 32 covering the openings of the through holes 24 can retard the vapor diffusion into the cavity 35. Therefore, the quality of the optical package structure is maintained for a long operation time to significantly enhance the weatherability and reliability of the optical package structure.

The through holes 24 may be filled with filler 241 to meet specific requirements. The filler 241 may be conductive material such as plated copper to increase the conductivity. Alternatively, the filler 241 may be solder mask or resin to increase stability or retard the vapor diffusion into the cavity 35. The openings of the through holes 24 on the second surface 212 of the substrate 21 may be connected to solder balls, pins, leads, pads, wires or electrodes according to various package types, e.g. ball grid array (BGA), leadless chip carrier (LCC), land grid array (LGA), quad flat package (QFP), quad flat no-lead (QFN). The structure of the through holes in the embodiment may be applied in the optical package structures in the embodiments hereinafter, and related description will not be repeated in the following embodiments.

FIGS. 4-10 illustrate modifications to the optical package structure of FIG. 2. Only the modifications are described with reference to the drawings, and the similar elements which have been described in the above embodiments are skipped. It is to be noted that the modifications in two or more embodiments can be combined to provide optical package structures having multiple functions.

Figure 4:
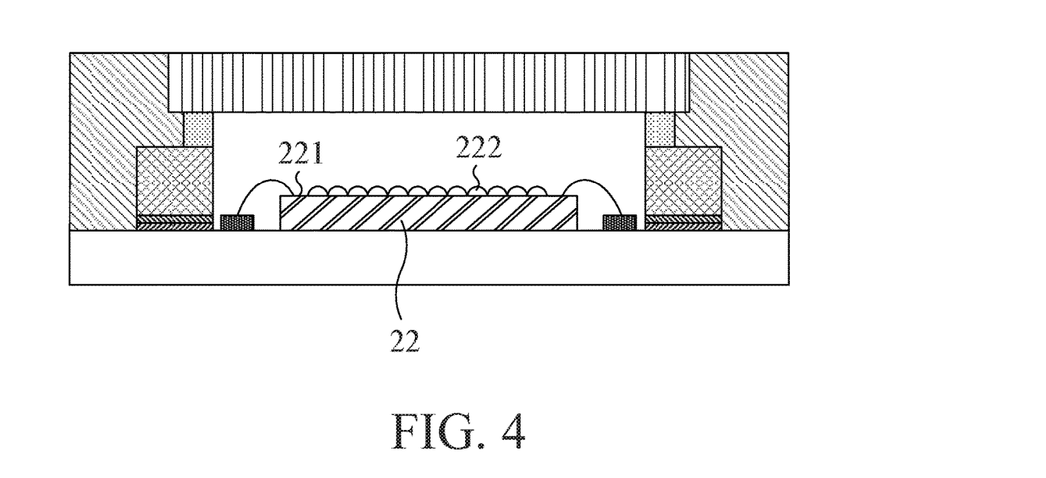
FIG. 4 is a side cross-sectional view illustrating an optical package structure according to a further embodiment of the present disclosure.

In FIG. 4, a plurality of optical microstructures 222 are disposed on the working surface (sensing surface) 221 of the optical unit 22. The microstructures 222 can perform diffraction, focusing or calibration to enhance the sensing performance of the optical unit 22. For example, the microstructures 222 form a micro lens array.

Figure 5:
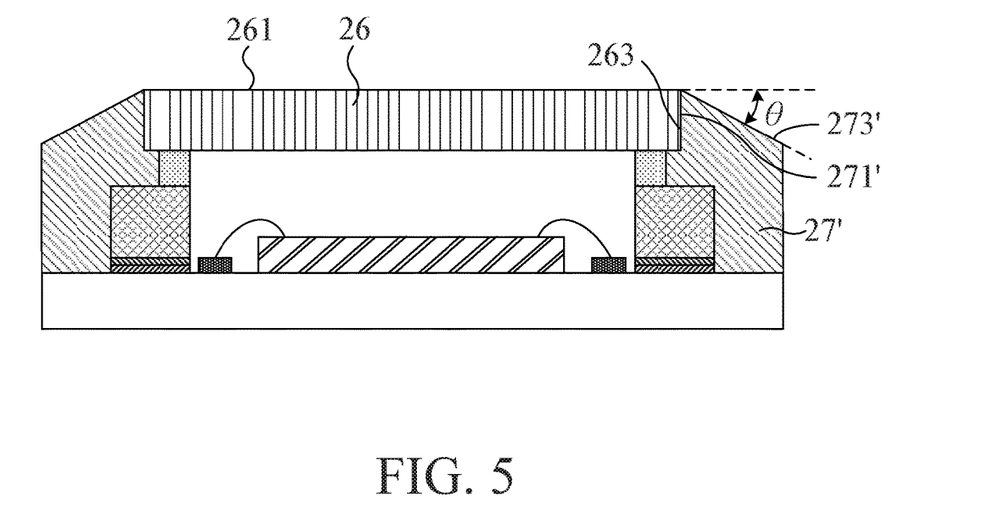
FIG. 5 is a side cross-sectional view illustrating an optical package structure according to a further embodiment of the present disclosure.

In FIG. 5, the encapsulation layer 27' is formed by curing or solidifying liquid compound. The encapsulation layer 27' may have a non-planar upper edge 273'. In the cross section, the upper edge 273' of the encapsulation layer 27' extends from the inner edge 271' (or intersection between the first surface 261 and the lateral edge 263 of the transparent plate 26) with a depression angle θ. The depression angle θ varies with the cohesive force of the liquid compound and the adhesive force between the liquid compound and the transparent plate 26 and the amount of the liquid compound, and the depression angle θ ranges from 5° to 60°.

Figure 6:
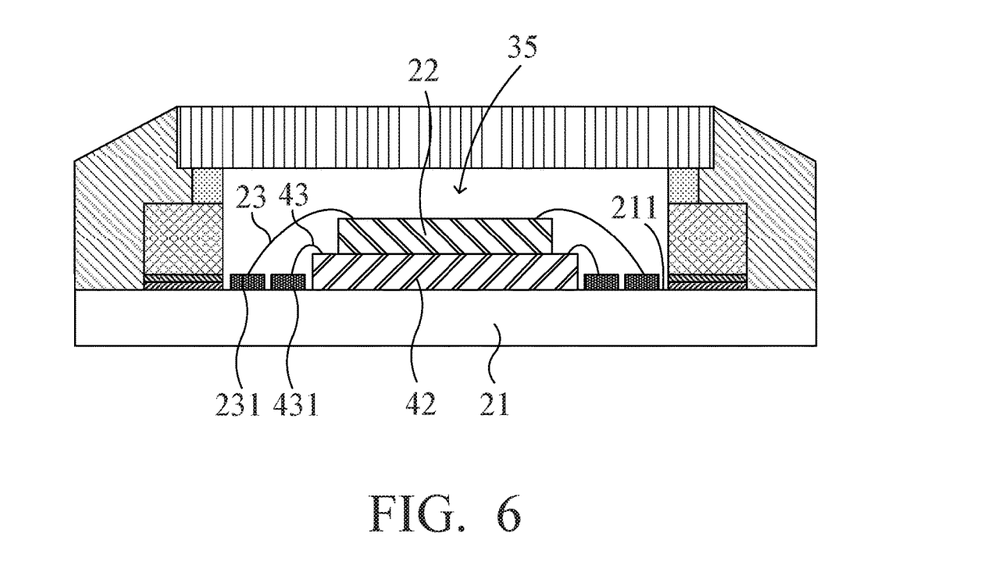
FIG. 6 is a side cross-sectional view illustrating an optical package structure according to a further embodiment of the present disclosure.

In FIG. 6, more than one chip is disposed in the cavity 35. In this embodiment, the optical unit 22 and a circuit chip 42 are stacked. For example, the optical unit 22 is an image sensor chip and the circuit chip 42 is an image signal processor (ISP) chip or a digital signal processor (DSP) chip. Several pads 231 and 431 are disposed on the first surface 211 of the substrate. The upper optical unit 22 is electrically connected to the pads 231 via the wires 23, while the lower circuit chip 42 is electrically connected to the pads 431 via the wires 43. Such design is applicable to the multi-chip package to reduce size of the electronic products. Since more than one chip is integrated in a single package structure, the volume of the single package structure is smaller than the overall volume of separate package structures.

Figure 7:
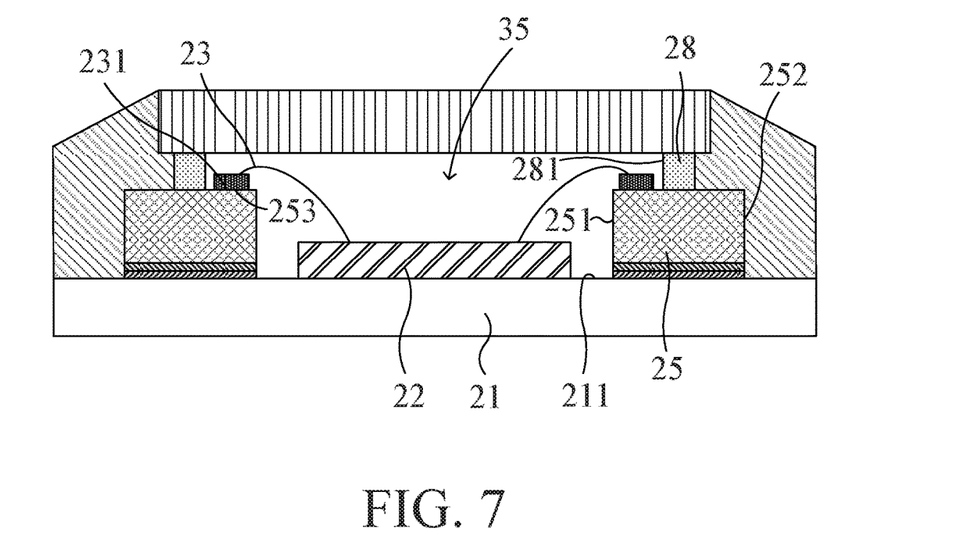
FIG. 7 is a side cross-sectional view illustrating an optical package structure according to a further embodiment of the present disclosure.

In FIG. 7, the pads 231 which are electrically connected to the optical unit 22 are disposed on the upper edge 253 of the frame layer 25 rather than the first surface 211 of the substrate 21. In this embodiment, the inner edge 281 of the bonding layer 28 is not aligned with the inner edge 251 of the frame layer 25. On the contrary, the inner edge 281 of the bonding layer 28 is set back from the inner edge 251 of the frame layer 25 so that an inner portion of the upper edge 253 of the frame layer 25 is not covered by the bonding layer 28. The pads 231 are disposed on the inner portion of the upper edge 253 of the frame layer 25. In this embodiment, additional conductive structures such as through holes/vias (not shown) are arranged in the frame layer 25 to electrically connecting the pads 231 to internal circuits or external circuits (not shown). In a multi-chip package structure, several corresponding pads 231 are provided inside the cavity 35. According to different applications, all of the pads 231 are disposed on the first surface 211 of the substrate 21 or the upper edge 253 of the frame layer 25. Alternatively, portions of the pads 231 are disposed on the first surface 211 of the substrate 21, and the other portions of the pads 231 are disposed on the upper edge 253 of the frame layer 25.

Figure 8:
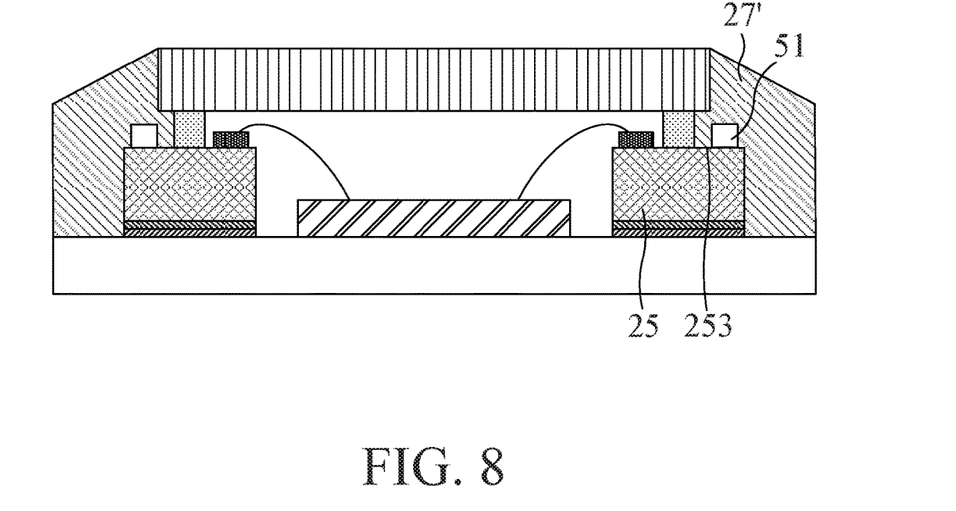
FIG. 8 is a side cross-sectional view illustrating an optical package structure according to a further embodiment of the present disclosure.

In FIG. 8, the optical package structure further includes at least one passive component 51 disposed on the upper edge 253 of the frame layer 25. The passive component 51 may be wrapped and protected by the encapsulation layer 27'. In this embodiment, additional conductive structures such as through holes/vias (not shown) are arranged in the frame layer 25 to electrically connecting the passive component 51 to internal circuits or external circuits (not shown).

Figure 9:
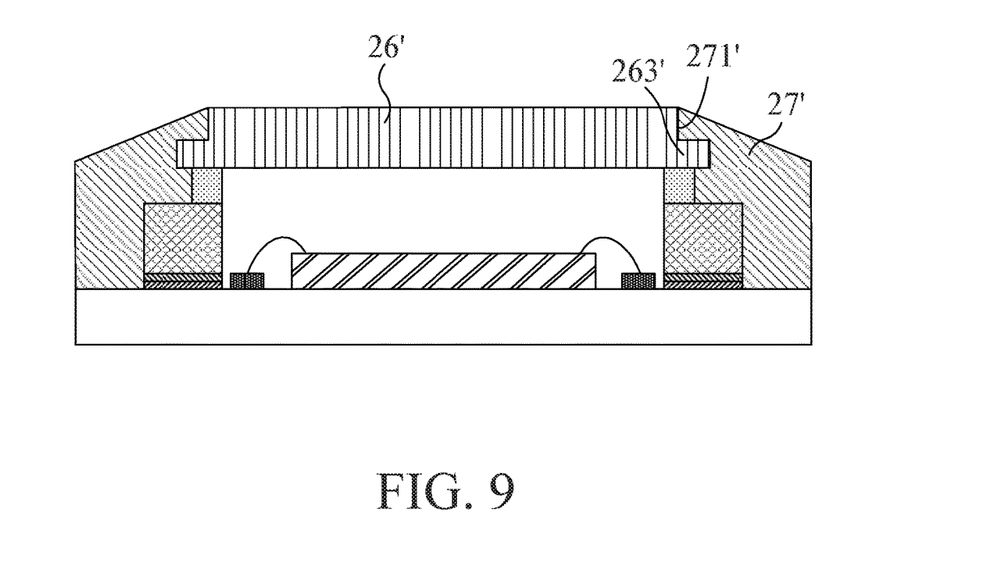
FIG. 9 is a side cross-sectional view illustrating an optical package structure according to a further embodiment of the present disclosure.

In FIG. 9, the transparent plate 26' has step-cut edges 263'. The inner edge 271' of the encapsulation layer 27' completely or nearly completely covers the step-cut edges 263' of the transparent plate 26' to increase the area of the contact surfaces with different directions between the encapsulation layer 27' and the transparent plate 26' so as to provide better clamping and locking effects. Therefore, the encapsulation layer 27' is firmly adhered to the transparent plate 26' to enhance reliability of the optical package structure.

Figure 10:
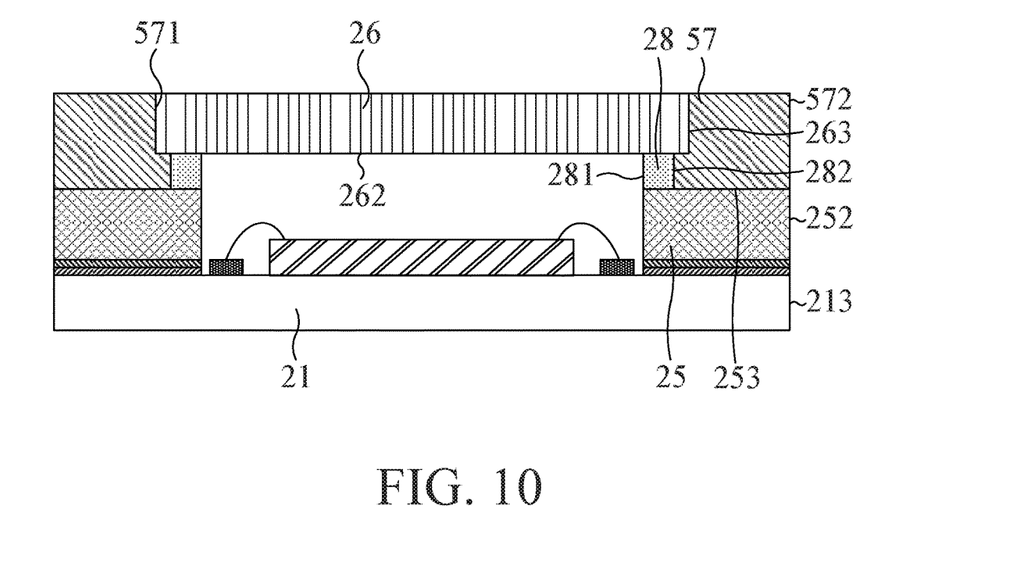
FIG. 10 is a side cross-sectional view illustrating an optical package structure according to a further embodiment of the present disclosure.

In FIG. 10, the outer edge 282 of the bonding layer 28 is set back from the lateral edge 263 of the transparent plate 26 and the outer edge 252 of the frame layer 25. In other words, the distance between the inner edge 281 and the outer edge 282 of the bonding layer 28 is shorter than the distance between the inner edge 281 of the bonding layer 28 and the lateral edge 263 of the transparent plate 26, and also shorter than the distance between the inner edge 281 of the bonding layer 28 and the outer edge 252 of the frame layer 25. As described above, the stress on the contact surfaces between the encapsulation layer 57 and the transparent plate 26/bonding layer 28 is dispersed to achieve better clamping and locking effects. Under this condition, further decreasing the amount of the encapsulation material is possible. A portion of the encapsulation layer 57 beyond the frame layer 25 may be reduced or even omitted. Thus, the outer edge 572 of the encapsulation layer 57 is aligned with the outer edge 252 of the frame layer 25, and the encapsulation layer 57 is not in contact with the substrate 21. In other words, the inner edge 571 of the encapsulation 57 is in contact with and adhered to the lateral edge 263 of the transparent plate 26, a portion of the second surface 262 of the transparent plate 26 (the portion between the outer edge 282 of the bonding layer 28 and the lateral edge 263 of the transparent plate 26), the outer edge 282 of the bonding layer 28, a portion of the upper edge 253 of the frame layer 25 (the portion between the outer edge 282 of the bonding layer 28 and the outer edge 252 of the frame layer 25). Therefore, the design can reduce the overall size of the optical package structure and the amount of the encapsulation material. The effects of minimizing the package structure and reducing production cost are achieved.

The features shown in FIGS. 3-10 include the specific positions of the through holes, the optical microstructures, the non-planar upper edge of the encapsulation layer, the stack structure of chips, the specific positions of the pads, the passive components, the step-cut edges of the transparent plate and the encapsulation layer with reduced encapsulation material may be combined or independently used to modify the optical package structure 20 of FIG. 2, so the real optical package structure according to the present disclosure is not limited to the exact forms shown in the drawings.

Figure 11A:
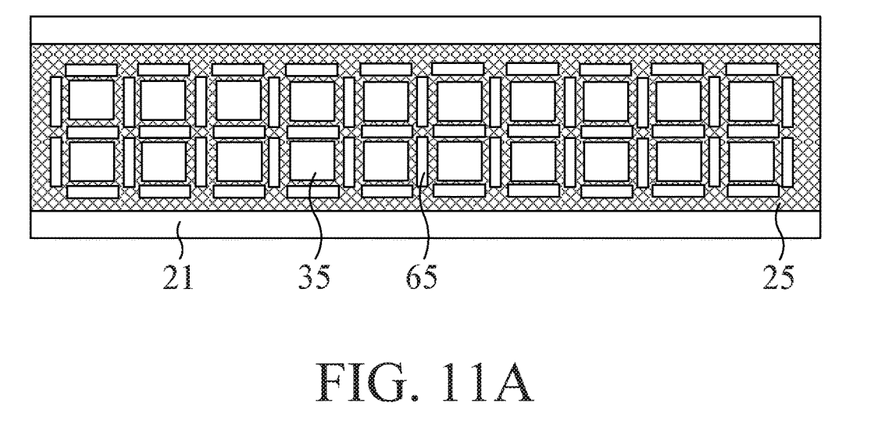
FIG. 11A is a top view illustrating substrate design for an optical package structure according to an embodiment of the present disclosure.
Figure 11B:
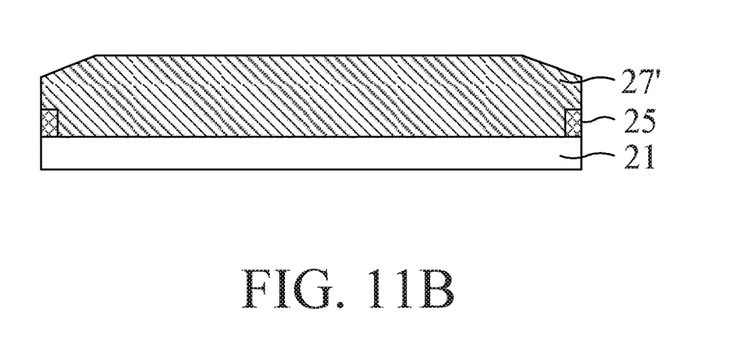
FIG. 11B is a side view illustrating the optical package structure manufactured based on the substrate design of FIG. 11A.

Please refer to FIG. 11A, a top view illustrating substrate design for an optical package structure according to an embodiment of the present disclosure. The frame layer 25 is formed on the first surface of the substrate 21 after formation of the though holes, the conductive members and the protection film (solder mask). A portion of the first surface of the substrate 21 where the cavity 35 will be formed is exposed from the frame layer 25. Slots 65 are formed on the periphery of the cavity 35. After mounting the optical unit(s) and/or chip(s), wire bonding step, applying the bonding layer and mounting the transparent plate, the molding compound is applied to the resultant structure other than the transparent plates to form the encapsulation layer 27'. The upper edge of the encapsulation layer 27' is approximately level with the first surface (upper surface) of the transparent plate or forms a concavity between every two adjacent transparent plates. Then, solder balls, pins, leads, pads, wires or electrodes are mounted on specific positions of the second face (back surface) of the substrate 21 according to the package type of the optical package structure. Subsequently, a singulation step is performed along the slots 65 to separate the whole structure into several optical package structures, and FIG. 11B is a side view illustrating a single optical package structure. Viewing from the side view, only the encapsulation layer 27' and the frame layer 25 at the corners can be seen on the substrate 21.

Figure 12A:
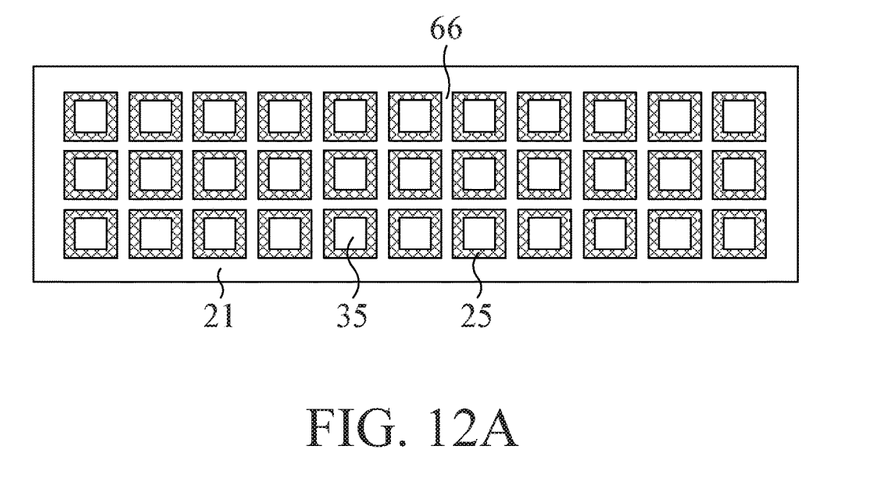
FIG. 12A is a top view illustrating substrate design for an optical package structure according to another embodiment of the present disclosure.
Figure 12B:
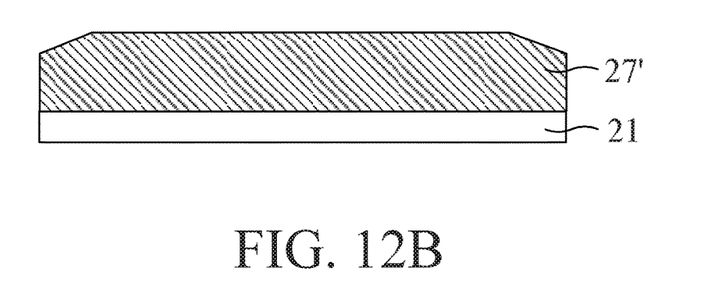
FIG. 12B is a side view illustrating the optical package structure manufactured based on the substrate design of FIG. 12A.

Please refer to FIG. 12A, a top view illustrating substrate design for an optical package structure according to another embodiment of the present disclosure. After formation of the though holes, the conductive members and the protection film (solder mask), the frame layer 25 is formed on the first surface of the substrate 21 to surround the cavity 35 wherein spaces 66 are present on the uncovered first surface of the substrate 21 between the separate frame layer 25. After mounting the optical unit(s) and/or chip(s), wire bonding step, applying the bonding layer and mounting the transparent plate, the molding compound is applied to the resultant structure other than the transparent plates to form the encapsulation layer 27'. The upper edge of the encapsulation layer 27' is approximately level with the first surface (upper surface) of the transparent plate or forms a concavity between every two adjacent transparent plates. Then, solder balls, pins, leads, pads, wires or electrodes are mounted on specific positions of the second surface (back surface) of the substrate 21 according to the package type of the optical package structure. Subsequently, a singulation step is performed along the spaces 66 to separate the whole structure into several optical package structures, and FIG. 12B is a side view illustrating a single optical package structure.

Viewing from the side view, only the encapsulation layer 27' can be seen on the substrate 21.

Figure 13A:
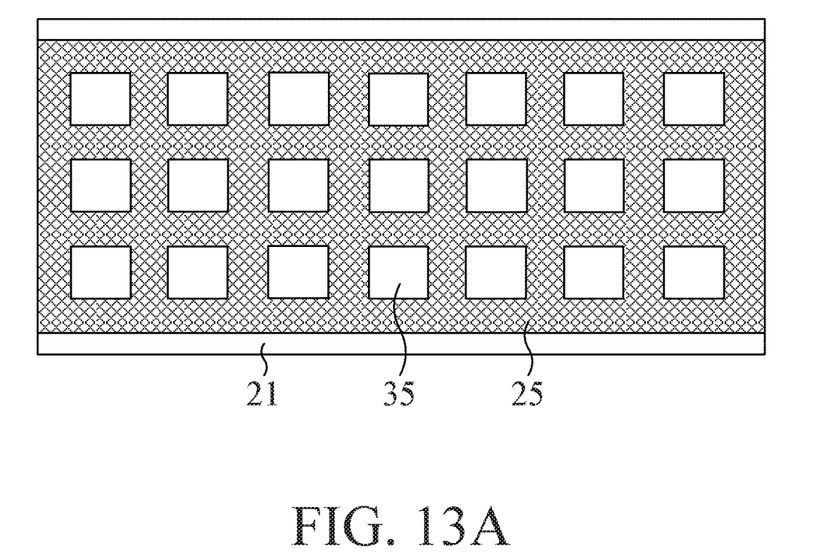
FIG. 13A is a top view illustrating substrate design for an optical package structure according to a further embodiment of the present disclosure.
Figure 13B:
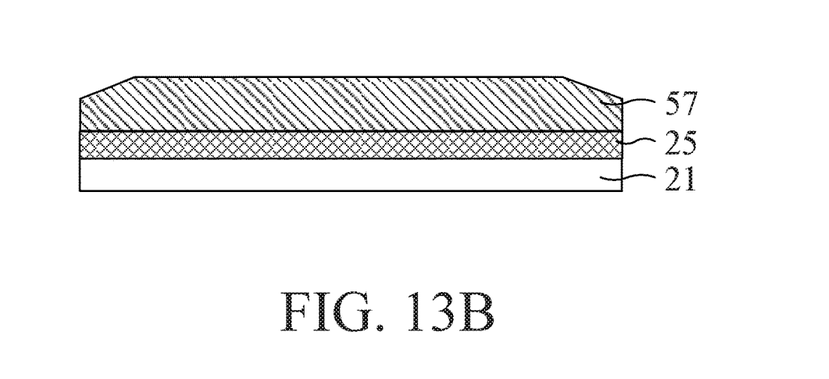
FIG. 13B is a side view illustrating the optical package structure manufactured based on the substrate design of FIG. 13A.

Please refer to FIG. 13A, a top view illustrating substrate design for an optical package structure according to a further embodiment of the present disclosure. The frame layer 25 is formed on the first surface of the substrate 21 after formation of the though holes, the conductive members and the protection film (solder mask). A portion of the first surface of the substrate 21 where the cavity 35 will be formed is exposed from the frame layer 25. After mounting the optical unit(s) and/or chip(s), wire bonding step, applying the bonding layer and mounting the transparent plate, the molding compound is applied to the resultant structure other than the transparent plates to form the encapsulation layer 57. The upper edge of the encapsulation layer 57 is approximately level with the first surface (upper surface) of the transparent plate or forms a concavity between every two adjacent transparent plates. Then, solder balls, pins, leads, pads, wires or electrodes are mounted on specific positions of the second surface (back surface) of the substrate 21 according to the package type of the optical package structure. Subsequently, a singulation step is performed to separate the whole structure into several optical package structures which are similar to the optical package structure in FIG. 10. FIG. 13B is a side view illustrating a single optical package structure. The encapsulation layer 57 covers the frame layer 25 and is not in contact with the substrate 21. The outer edge of the frame layer 25 is aligned with the lateral edge of the substrate 21.

It is to be noted that the substrate layouts in FIGS. 11A-13A are present only for illustration, and the quantities of the optical package structures are not limited to the embodiments. The quantity of the optical package structures may be adjusted according to the real design and process capability.

In conclusion, according to the present disclosure, the lateral edge of the transparent plate, the outer edge of the bonding layer and the outer edge of the frame layer do not construct a planar surface, and a recess is formed beside the outer edge of the bonding layer. Such design can enhance bonding effect of the encapsulation layer. Based on the enhanced bonding effect, the present disclosure can further seek reduction of the encapsulation material. On the other hand, according to the present disclosure, the vapor entering into the internal cavity of the optical package structure is reduced to prevent from the adverse effects on the internal elements. Therefore, the present disclosure provides a smaller optical package structure with better reliability and weatherability.

While the disclosure has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An optical package structure comprising:
   a substrate having a first surface and a second surface opposite to the first surface;
   a frame layer formed on the first surface of the substrate and surrounding a cavity on the substrate, the frame layer having a first surface and a second surface opposite to each other, wherein the first surface of the frame layer faces toward the cavity and the second surface of the frame layer faces away from the cavity;
   an optical unit disposed on the first surface of the substrate and located inside the cavity;
   a bonding layer formed on a portion of an upper edge of the frame layer and exposing the other portion of the upper edge of the frame layer;
   a transparent plate mounted on the bonding layer and extending across the optical unit, the transparent plate extending beyond an outer edge of the bonding layer, the transparent plate having a first surface and a second surface opposite to the first surface and facing toward the optical unit; and
   an encapsulation layer covering a lateral edge of the transparent plate and the outer edge of the bonding layer, the encapsulation layer being in contact with a portion of the second surface of the transparent plate and a portion of the upper edge of the frame layer, an external lateral surface of the encapsulation layer which faces away from the cavity being aligned with the second surface of the frame layer.

2. The optical package structure according to claim 1, wherein an upper edge of the encapsulation layer extends from an inner edge of the encapsulation layer with a depression angle, and the depression angle ranges from 5° to 60°.

3. The optical package structure according to claim 1, wherein the optical package structure further comprises:
   at least one wire electrically connected to the optical unit; and
   at least one pad electrically connected to the at least one wire, the pad being disposed on the first surface of the substrate or the exposed portion of the upper edge of the frame layer.

4. The optical package structure according to claim 1, wherein a plurality of through holes are provided in the substrate and connecting the first surface and the second surface of the substrate, openings of the through holes on the first surface of the substrate being located under the optical unit, the frame layer or the encapsulation layer.

5. The optical package structure according to claim 4, wherein a protection film is formed between the openings of the through holes and the optical unit, the frame layer or the encapsulation layer.

6. The optical package structure according to claim 5, wherein the protection film is solder mask.

7. The optical package structure according to claim 4, wherein the through holes are filled with conductive material, solder mask or resin.

8. The optical package structure according to claim 1, wherein the transparent plate has a step-cut edge, and the encapsulation layer covers the step-cut edge of the transparent plate.

9. The optical package structure according to claim 1, wherein the optical unit is an image sensor chip.

10. The optical package structure according to claim 1, wherein a plurality of optical microstructures are disposed on a sensing surface of the optical unit.

11. The optical package structure according to claim 1, wherein the optical unit is disposed on a circuit chip.

* * * * *